United States Patent
Song et al.

(10) Patent No.: US 10,446,352 B2
(45) Date of Patent: Oct. 15, 2019

(54) SYSTEM AND METHOD FOR INDEPENDENTLY CONTROLLING RELAY, USING BIMETAL

(71) Applicant: LG CHEM, LTD., Seoul (KR)

(72) Inventors: Hyeon Jin Song, Daejeon (KR); Yanglim Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/576,961

(22) PCT Filed: Aug. 30, 2016

(86) PCT No.: PCT/KR2016/009628
§ 371 (c)(1),
(2) Date: Nov. 27, 2017

(87) PCT Pub. No.: WO2017/086577
PCT Pub. Date: May 26, 2017

(65) Prior Publication Data
US 2018/0151319 A1  May 31, 2018

(30) Foreign Application Priority Data
Nov. 17, 2015 (KR) .......................... 10-2015-0161018

(51) Int. Cl.
*H01H 61/06* (2006.01)
*G01R 19/00* (2006.01)
(Continued)

(52) U.S. Cl.
CPC ............ *H01H 61/063* (2013.01); *B60R 16/03* (2013.01); *G01R 19/0092* (2013.01);
(Continued)

(58) Field of Classification Search
CPC .... H01H 61/063; H01H 37/60; H01H 47/002; H01H 61/013; H01H 61/04; H01H 37/52;
(Continued)

(56) References Cited

U.S. PATENT DOCUMENTS 5,633,774 A * 5/1997 Robertson ................ H02H 1/06
361/24
5,659,454 A * 8/1997 Vermesse ......... G07B 17/00193
337/371
(Continued)

FOREIGN PATENT DOCUMENTS

EP 1420433 A1 5/2004
EP 2695762 A2 2/2014
(Continued)

OTHER PUBLICATIONS

Maeda Naohide; Fujita Nobuhiko, "Controller for Wound-Field Rotating Electric Machine", Jun. 21, 2007, Mitsubishi Electric Corp, Entire Document (Translation of JP 2007159355). (Year: 2007).*
(Continued)

*Primary Examiner* — Anatoly Vortman
*Assistant Examiner* — Stephen S Sul
(74) *Attorney, Agent, or Firm* — Birch, Stewart, Kolasch & Birch, LLP

(57) ABSTRACT

The present invention relates to a system and a method for independently controlling a relay using bimetal which allow bimetal to operate based on a signal output from a micro controller unit when current of a predetermined threshold or more flows on a circuit to allow current which flows between a battery and the relay to flow bypassing the bimetal to independently control the relay regardless of whether a circuit pattern is abnormal.

14 Claims, 3 Drawing Sheets

(51) Int. Cl.
  *H01H 37/52* (2006.01)
  *H01H 61/04* (2006.01)
  *B60R 16/03* (2006.01)
  *H01H 37/00* (2006.01)
  *H01H 37/54* (2006.01)
  *H01H 61/00* (2006.01)
  *H01H 61/02* (2006.01)
  *H01H 47/00* (2006.01)
  *H01H 61/013* (2006.01)
  *H02J 7/00* (2006.01)

(52) U.S. Cl.
  CPC ............ *H01H 37/00* (2013.01); *H01H 37/52* (2013.01); *H01H 37/54* (2013.01); *H01H 47/002* (2013.01); *H01H 61/00* (2013.01); *H01H 61/013* (2013.01); *H01H 61/02* (2013.01); *H01H 61/04* (2013.01); *H02J 7/0029* (2013.01); *H02J 2007/0039* (2013.01)

(58) Field of Classification Search
  CPC ........ H01H 61/02; H01H 37/54; H01H 37/00; H01H 61/00; H01H 47/325; H01H 47/32; H01H 2071/749; H02J 7/0029; H02J 2007/0039; G01R 19/0092; B60R 16/03; G05D 23/2754
  USPC .......................................... 337/105, 333, 334
  See application file for complete search history.

(56) References Cited

U.S. PATENT DOCUMENTS

| | | | | |
|---|---|---|---|---|
| 5,746,053 | A * | 5/1998 | Hibino | F01N 3/2013 219/202 |
| 5,875,085 | A * | 2/1999 | Farley | H01L 27/0248 257/E29.255 |
| 7,326,887 | B1 | 2/2008 | Sullivan et al. | |
| 2002/0145841 | A1 * | 10/2002 | Williams | H02H 1/04 361/93.1 |
| 2005/0103613 | A1 * | 5/2005 | Miller | H01H 71/04 200/400 |
| 2006/0208846 | A1 * | 9/2006 | Davis | H01H 37/54 337/333 |
| 2008/0088991 | A1 * | 4/2008 | Elms | H01H 71/162 361/42 |
| 2008/0151463 | A1 * | 6/2008 | Dwyer | H01H 47/32 361/186 |
| 2010/0157486 | A1 * | 6/2010 | Parker | H02H 1/0015 361/2 |
| 2011/0164340 | A1 * | 7/2011 | Takeda | H01H 37/5427 361/25 |
| 2012/0008245 | A1 * | 1/2012 | Moffitt | H02H 3/085 361/103 |
| 2013/0076479 | A1 * | 3/2013 | Maloney | H01H 69/01 337/298 |
| 2015/0229118 | A1 * | 8/2015 | Hasunuma | H01C 7/02 361/93.8 |

FOREIGN PATENT DOCUMENTS

| | | |
|---|---|---|
| JP | 8-171941 A | 7/1996 |
| JP | 2007-159355 A | 6/2007 |
| JP | 2012-230908 A | 11/2012 |
| KR | 10-2008-0055674 A | 6/2008 |
| KR | 10-2009-0035155 A | 4/2009 |
| KR | 10-2013-0084875 A | 7/2013 |
| KR | 10-2015-0083740 A | 7/2015 |

OTHER PUBLICATIONS

Jeon Ji Hoon, "Apparatus of Relay Having Function of Protecting Over-Current Inflow", Apr. 9, 2009, Hyundai Motor CO LTD, Entire Document (Translation of KR 20090035155). (Year: 2009).*

International Search Report for PCT/KR2016/009628 dated Dec. 6, 2016.

Extended European Search Report, dated Jul. 18, 2018, for European Application No. 16866530.5.

* cited by examiner

[Figure 1]
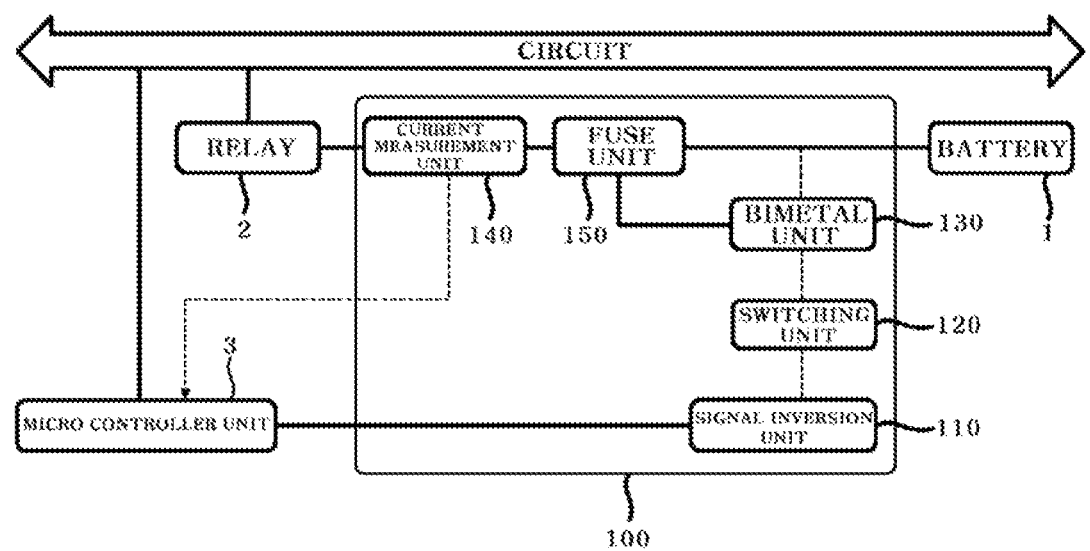

[Figure 2]
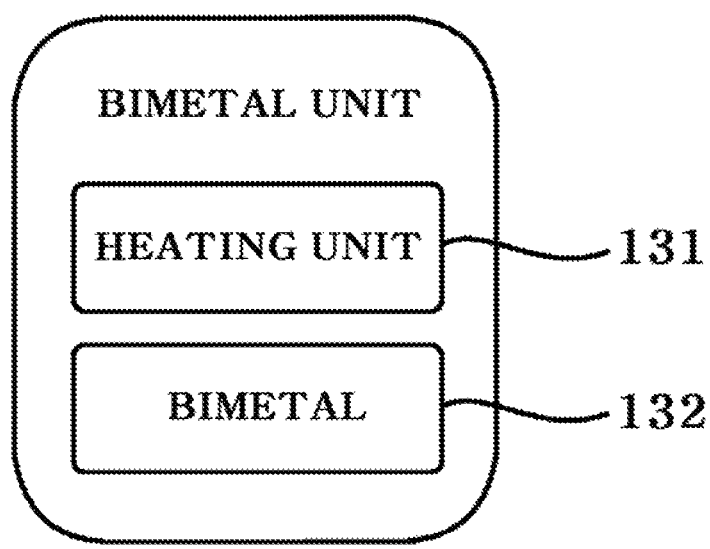

[Figure 3]
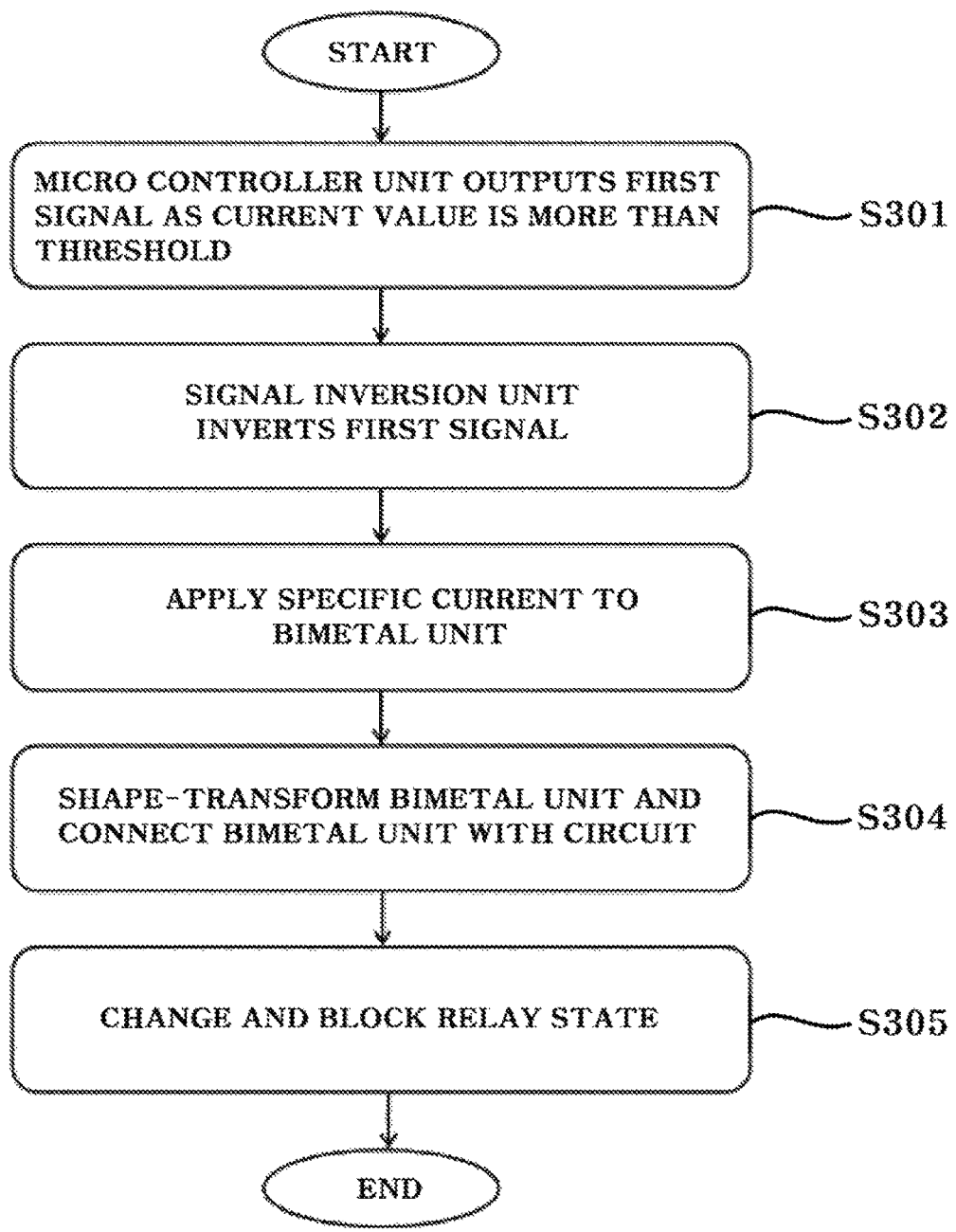

SYSTEM AND METHOD FOR INDEPENDENTLY CONTROLLING RELAY, USING BIMETAL

TECHNICAL FIELD

This application claims priority to and the benefit of Korean Patent Application No. 10-2015-0161018 filed in the Korean Intellectual Property Office on Nov. 17, 2015, the entire contents of which are incorporated herein by reference.

The present invention relates to a system and a method for independently controlling a relay using bimetal, and more particularly, to a system and a method for independently controlling a relay using bimetal which allow the bimetal to operate based on a signal output from a micro controller unit (MCU) when current of a predetermined threshold or more flows on a circuit to allow current which flows between a battery and a relay to flow bypassing the bimetal to independently control the relay regardless of whether a circuit pattern is abnormal.

In particular, the present invention relates to a system and a method for independently controlling a relay using bimetal which generate a low signal in a micro controller unit only in an abnormal case in which overcurrent which is over a threshold flows and invert the generated low signal into a high signal and thereafter, operate the bimetal based on the high signal.

BACKGROUND ART

In general, in the case of a plug-in hybrid electric vehicle (PHEV) that travels by using energy output from a battery as a power source, it is necessary to charge an internal battery by driving a vehicle motor and in this case, an element called a relay is used to apply current which flows between a charge source and a battery or block the current between the charge source and the battery.

Moreover, when various elements need to be protected in a situation in which overcurrent which is more than a threshold flows on an internal circuit of the electric vehicle, a state of the relay is changed from an on state to an off state, and as a result, the current on the circuit is blocked to protect various elements.

Meanwhile, in the electric vehicle, the relay in the related art is controlled by a micro controller unit (MCU) and the micro controller unit allows a constant current to flow on a relay coil to generate magnetic force and a moving core contacts both contacts between the circuits by the generated magnetic force to maintain the current to be applied between the circuits.

However, as the magnetic force generated from the relay coil is diffused to the outside, there is a problem in that electro magnetic interference (EMI) occurs.

Further, since the constant current needs to flow on the relay coil in order for the moving core to maintain the contact both contacts between the circuits, there is a problem in that a power consumption rate of the relay in the related art is high.

Moreover, in the relay in the related art, when an error occurs in a pattern on the circuit between a high side driver or the micro controller unit and the relay, even though the overcurrent which is more than a threshold flows, a circuit for independently controlling the relay is not configured, and as a result, there is a problem in that the relay cannot be controlled.

Accordingly, in order to solve the problems of the relay in the related art, the present inventor has invented a system and a method for independently controlling the relay using bimetal which allow the bimetal to operate based on a signal output from the micro controller unit when the current of the predetermined threshold or more flows on the circuit to allow current which flows between the battery and the relay to flow bypassing the bimetal to independently control the relay regardless of whether the circuit pattern is abnormal.

DETAILED DESCRIPTION OF THE INVENTION

Technical Problem

The present invention is contrived to solve the problem and the present invention has been made in an effort to provide a system and a method for independently controlling a relay using bimetal which allow the bimetal to operate based on a signal output from a micro controller unit when current of a predetermined threshold or more flows on a circuit to allow current which flows between a battery and a relay to flow bypassing the bimetal to independently control the relay regardless of whether a circuit pattern is abnormal and generate a low signal in a micro controller unit only in an abnormal case in which overcurrent which is over a threshold flows and invert the generated low signal into a high signal and thereafter, operate the bimetal based on the high signal.

Technical Solution

Among embodiments of the present invention, a system for independently controlling a relay using bimetal may include: a bimetal unit configured to be connected with a relay provided in a circuit and shape-transformed by current; and a switching unit configured to apply specific current to the bimetal unit based on a signal output from a micro controller unit (MCU).

In the embodiment, when a current value on the circuit is more than a predetermined threshold and the micro controller unit thus outputs a first signal, the bimetal unit may be shape-transformed by the specific current applied from the switching unit and connected with the circuit and the current on the circuit may be applied to the bimetal unit to change a state of the relay from an on state to an off state.

In the embodiment, the bimetal unit may include a heating unit generating heat by the current, and bimetal bent in one direction by the heat.

In the embodiment, when the bimetal is bent in one direction, one terminal portion of the bimetal may contact a contact of the circuit and the current on the circuit may be applied to one terminal portion of the bimetal.

In the embodiment, when the current on the circuit is applied to the bimetal, a current amount of current applied to the relay is reduced in the circuit to change the state of the relay from the on state to the off state.

In the embodiment, the heating unit may be a polymeric PTC (PPTC).

In the embodiment, the system may further include a signal inversion unit inverting the signal output from the micro controller unit.

In the embodiment, the signal inversion unit may invert a low signal output from the micro controller unit into a high signal.

In the embodiment, the switching unit may be a field effect transistor (FET).

In the embodiment, the system may further include a current measurement unit measuring the current value on the circuit and providing the measured current value to the micro controller unit.

In the embodiment, the micro controller unit may output the first signal when the current value provided from the current measurement unit is more than the predetermined threshold.

In the embodiment, the current measurement unit may be a shunt resistor.

In the embodiment, the system may further include a fuse unit configured so that an inner part is disconnected by the heat generated from the heating unit in connection with the heating unit.

In the embodiment, when the inner part of the fuse unit is disconnected by the heat, the current applied to the relay may be blocked in the circuit.

A method for independently controlling a relay using bimetal according to another embodiment of the present invention may include: outputting, by a micro controller unit (MCU), a first signal according to whether a current value on a circuit is more than a predetermined threshold; applying, by a switching unit, specific current to a bimetal unit; being, by the bimetal unit, shape-transformed by the specific current applied from the switching unit and connected with the circuit; and changing a state of the relay from an on state to an off state by applying the current on the circuit to the bimetal unit.

In the embodiment, the inverting, by the signal inversion unit, the first signal may include inverting a low signal output from the micro controller unit into a high signal.

In the embodiment, the method may further include inverting, by the signal inversion unit, the signal output from the micro controller unit.

In the embodiment, the inverting of the signal may include inverting, by the signal inversion unit, a low signal output from the micro controller unit into a high signal.

In the embodiment, the being connected with the circuit may include generating, by a heating unit, the heat by the current, bending bimetal in one direction by the heat, and applying the current on the circuit to one terminal portion of the bimetal as one terminal portion of the bimetal contacts a contact of the circuit.

In the embodiment, the applying of the current on the circuit may include changing the state of the relay from the on state to the off state as a current amount of current applied to the relay is reduced in the circuit.

In the embodiment, the method may further include measuring, by a current measurement unit, the current value on the circuit and providing the measured current value to the micro controller unit.

In the embodiment, the outputting of the first signal according to whether the current value on the circuit is more than a predetermined threshold may include outputting, by the micro controller unit, the first signal when the current value provided from the current measurement unit is more than the predetermined threshold.

In the embodiment, the being connected with the circuit may further include being, by an inner part of a fuse unit connected with the heating unit, disconnected by the heat generated from the heating unit in connection with the heating unit.

In the embodiment, the being disconnected may include blocking the current applied to the relay in the circuit as the inner part of the fuse unit is disconnected by the heat.

Advantageous Effects

A system for independently controlling a relay using bimetal according to an embodiment of the present invention allows the bimetal to operate based on a signal output from a micro controller unit (MCU) when current of a predetermined threshold or more flows on a circuit to allow current which flows between a battery and a relay to flow bypassing the bimetal to independently control the relay regardless of whether a circuit pattern is abnormal.

Further, a low signal is generated in a micro controller unit only in an abnormal case in which overcurrent which is over a threshold flows and the generated low signal is inverted into a high signal and thereafter, the bimetal is operated based on the high signal, and as a result, in a normal case, constant current is not applied to the bimetal and the relay, thereby drastically reducing a power consumption rate.

In addition, since in the present invention, PPTC is used, which easily generates heat even in the case of micro current, the bimetal can be operated only by the micro current. In particular, a bimetal shape can be maintained to be bent by the PPTC.

Further, as in the present invention, the bimetal is used instead of a relay coil in the related art, the relay coil does not exist, and as a result, electromagnetic interference does not occur.

In addition, in the present invention, since it is possible to design a circuit in order to independently control the relay, functional safety is enhanced.

Moreover, in the present invention, since the overcurrent exceeding the threshold may flow bypassing the bimetal rather than the relay, the amount of current applied to the relay is limited, so that a relay state can be automatically changed from an on state to an off state without applying a separate signal.

BRIEF DESCRIPTION OF DRAWINGS

FIG. 1 is a diagram schematically illustrating a configuration of a system 100 for independently controlling a relay using bimetal according to an embodiment of the present invention.

FIG. 2 is a diagram schematically illustrating a configuration of a bimetal unit 130 illustrated in FIG. 1.

FIG. 3 is a flowchart sequentially illustrating an operation of a system 100 for independently controlling a relay using bimetal according to an embodiment of the present invention.

BEST MODE

Hereinafter, a preferred embodiment is presented in order to assist understanding of the present invention. However, the following embodiment is just provided to more easily understand the present invention and contents of the present invention are not limited by the embodiment.

FIG. 1 is a diagram schematically illustrating a configuration of a system 100 for independently controlling a relay using bimetal according to an embodiment of the present invention and FIG. 2 is a diagram schematically illustrating a configuration of a bimetal unit 130 illustrated in FIG. 1.

Referring to FIGS. 1 and 2, a system 100 for independently controlling a relay using bimetal may be provided between a battery 1 and a relay 2 in a circuit and may be configured to include a signal inversion unit 110, a switching unit 120, and a bimetal unit 130 and in the embodiment, the system 100 may' further include a current measurement unit 140 and a fuse unit 150.

First, the signal inversion unit 110 may serve to invert a signal output from the micro controller unit (MCU) 3.

Herein, the micro controller unit 3 may mean an operation device that is provided on a circuit in a drawing illustrated in the present invention to measure a current value of current which flows on the circuit and determine whether the measured current value is more than a threshold and further, when the current value of the current which flows on the circuit is more than a predetermined threshold, the micro controller unit 3 may serve to output the resulting first signal to the signal inversion unit 110.

Further, the micro controller unit 3 receives the current value on the circuit, which is measured through the current measurement unit 140 to be described below to determine whether the corresponding current value is more than the predetermined threshold.

In addition, in the present invention, the first signal may correspond to a low signal which may express that the current value of the current which currently flows on the circuit is more than the predetermined threshold and in a normal state (a state in which the current value is not more than the predetermined threshold), the first signal may not be output and only in an abnormal state (a state in which the current value is more than the predetermined threshold), the first signal may be output by the micro controller unit 3.

Meanwhile, the signal inversion unit 110 inverts the low signal output from the micro controller unit 3 into a high signal, and as a result, a switching unit 120 to be described below may receive the inverted signal.

The signal inversion unit 110 may correspond to, for example, an inversion amplification circuit or an inversion amplification element that outputs the signal in which a phase of an input signal (low signal) is opposite and an absolute magnitude of the signal is amplified.

In the embodiment, the micro controller unit 3 may output not the low signal but the high signal and the signal inversion unit 110 may invert the high signal into the low signal and thereafter, output the low signal to the switching unit 120 to be described below, and as a result, the switching unit 120 may receive the inverted low signal.

Meanwhile, since the signal inversion unit 110 adopts a known technique in the related art, a detailed description of a configuration and a structure will be omitted.

Next, the switching unit 120 may serve to apply specific current to the bimetal unit 130 to be described below based on the first signal inverted through the signal inversion unit 110.

Herein, the specific current may mean current to operate the bimetal unit 130 and in more detail, the specific current may mean current that allows a heating unit 131 in the bimetal unit 130 to be described below to easily generate heat.

In the embodiment, the switching unit 120 may be a field effect transistor (FET) and a role of the switching unit 120 may correspond to a switch role that applies the specific current to the bimetal unit 130 or blocks the specific current based on the signal output from the signal inversion unit 110.

In the embodiment, it is noted that the switching unit 120 may include all elements that may serve as the switch role that applies the specific current to the bimetal unit 130 or blocks the specific current based on the signal output from the signal inversion unit 110 in addition to the field effect transistor.

Meanwhile, since the switching unit 120 adopts the known technique in the related art, the detailed description of the configuration and the structure will be omitted.

Next, the bimetal unit 130 may serve as a bridge that is provided between the battery 1 and the relay 2 and shape-transformed by the current to bypass the current which flows on the circuit.

The bimetal unit 130 may be configured to include the heating unit 131 and bimetal 132.

First, the heating unit 131 may be directly connected with the bimetal 132 to be described below or be formed to cover an exterior of the bimetal 132 and may be a polymeric PTC (PPTC) which is a polymer type positive characteristic thermistor.

The heating unit 131 may generate heat with a rise in temperature while electric resistance in the heating unit 131 rapidly increases when micro current flows and in this case, a shape of the bimetal 132 may be transformed by the generated heat.

In the embodiment, it is noted that the heating unit 131 may correspond to all materials which may easily generate the heat by the micro current in addition to the PPTC.

Meanwhile, since the heating unit 131 adopts the known technique in the related art, the detailed description of the configuration and a composition of the heating unit 131 will be omitted.

Next, the bimetal 132 is bent in one direction by the heat generated from the heating unit 131 to serve to receive the current on the circuit in contact with a contact of the circuit.

In more detail, the bimetal 132 may be formed in a shape in which two types of metals having different thermal expansion coefficients are overlapped with each other and the bimetal 132 is bent toward the contact of the circuit while the metal having the larger thermal expansion coefficient is more expanded by the heat generated by the heating unit 131, and as a result, the current which flows on the circuit flows bypassing not the relay 2 but the bimetal 132 while a moving core provided at one side of the bimetal 132 contacts the contact of the circuit.

Therefore, since a current amount of the current applied to the relay 2 is limited, the relay is consequently blocked while the state of the relay 2 is changed from the on state to the off state while magnetic force of a relay coil in the relay 2 is reduced.

In the embodiment, the heating unit 131 may easily generate the heat by the micro current and in particular, since the heating unit 131 may store the heat generated by the heating unit 131 for a predetermined time or longer, the bimetal 132 may correspondingly maintain the shape bent to one side for a predetermined time or longer.

In the embodiment, the system 100 for independently controlling a relay using bimetal according to the present invention may further include the current measurement unit 140 and a fuse unit 150.

First, the current measurement unit 140 may serve to actually measure the current value on the circuit and provide the measured current value to the micro controller unit 3, and as a result, the micro controller unit 3 may output the first signal when the current value provided from the current measurement unit 140 is more than the predetermined threshold.

The current measurement unit 140 may be provided even at any location on the circuit, but is preferably provided at a location adjacent to the relay 2.

In the embodiment, the current measurement unit 140 may be a shunt resistor or a current measurement sensor module.

Next, the fuse unit 150 may be provided between the battery 1 and the relay 2 and may be configured so that an inner part is disconnected by the heat generated by the heating unit 131 in connection with the heating unit 131 in the bimetal unit 130.

Therefore, when the inner part of the fuse unit 150 is disconnected by the heat of the heating unit 131, the current applied from the battery 1 to the relay 2 is blocked, and as a result, an operation state of the relay 2 is changed from the on state to the off state.

Next, an operation of independently controlling the relay 2 through the system 100 for independently controlling a relay using bimetal according to the present invention will be described in more detail through FIG. 3.

FIG. 3 is a flowchart sequentially illustrating an operation of a system 100 for independently controlling a relay using bimetal according to an embodiment of the present invention.

First, as the current value of the current which flows on the circuit is more than the predetermined threshold, the micro controller unit 3 outputs the first signal (low signal) as a meaning of a warning (S301). In this case, after the current which flows on the circuit is measured by the current measurement unit 140, the measured current value may be provided to the micro controller unit 3.

Next, the signal inversion unit 110 inverts the first signal (low signal) and outputs the high signal and thereafter, outputs the inverted high signal to the switching unit 120 (S302) and the switching unit 120 allows specific current to be applied to the bimetal unit 130 to allow the heating unit 131 in the bimetal unit 130 to generate heat by the specific current (S303).

Next, the shape transformation in which the bimetal 132 is bent in one direction occurs and the moving core provided at one side of the bimetal 132 is connected with the circuit while contacting the contact of the circuit (S304), and as a result, overcurrent which flows on the circuit flows bypassing not the relay 2 but the bimetal 132. In this case, as the inner part of the fuse unit 150 connected with the heating unit 131 is disconnected by the heat of the heating unit 131, the current which flows from the battery 1 to the relay 2 may be blocked.

Next, since the current is restricted or blocked to the relay 2, the magnetic force of the relay 2 is consequently reduced, and as a result, the state of the relay 2 is changed from the on state to the off state to block the relay 2 (S305).

As described above, the system and the method for independently controlling a relay using bimetal according to the present invention allow the bimetal to operate based on a signal output from a micro controller unit when current of a predetermined threshold or more, which flows on a circuit flows to allow current which flows between a battery and a relay to flow bypassing the bimetal to independently control the relay regardless of whether a circuit pattern is abnormal and generate a low signal in a micro controller unit only in an abnormal case in which when overcurrent which is over a threshold flows and invert the generated low signal into a high signal and thereafter, operates the bimetal based on the high signal to prevent unnecessary current from being supplied to the bimetal and the relay in a normal case in which the overcurrent does not flow, thereby minimizing power consumption.

The present invention has been described with reference to the preferred embodiments, but those skilled in the art will understand that the present invention can be variously modified and changed without departing from the spirit and the scope of the present invention which are defined in the appended claims.

The invention claimed is:

1. A system for independently controlling a relay in a circuit, the system comprising:
   a micro controller unit (MCU) configured to output a signal when a current value on the circuit is more than a predetermined threshold;
   a signal inversion unit configured to:
   receive the signal directly from the MCU, and
   invert and amplify the signal output from the MCU; and
   a switching unit configured to:
   receive the inverted and amplified signal directly from the signal inversion unit, and
   apply a specific current directly to a bimetal unit based on the signal output from the signal inversion unit,
   wherein the bimetal unit is configured to receive the specific current directly from the switching unit and is connected with the relay provided in the circuit,
   wherein the bimetal unit includes:
   a heating unit generating heat by the specific current, and
   a bimetal, the bimetal being configured to be bent in one direction by the heat,
   wherein the heating unit is directly connected with the bimetal,
   wherein the system further comprises a fuse unit provided between the bimetal unit and the relay and having an inner part configured to be disconnected by the heat generated from the heating unit, and
   wherein the MCU outputs the signal, the bimetal unit is shape-transformed by the specific current applied from the switching unit to change a state of the relay from an on state to an off state to reduce a magnetic force of a relay coil of the relay and to block current flowing from a battery to the relay.

2. The system of claim 1, wherein when the bimetal is bent in one direction, one terminal portion of the bimetal contacts a contact of the circuit and the specific current on the circuit is applied to one terminal portion of the bimetal.

3. The system of claim 2, wherein when the specific current on the circuit is applied to the bimetal, a current amount applied to the relay is reduced in the circuit to change the state of the relay from the on state to the off state.

4. The system of claim 1, wherein the signal inversion unit inverts a low signal output from the MCU into a high signal.

5. The system of claim 1, wherein the switching unit is a field effect transistor (FET).

6. The system of claim 1, further comprising:
   a current measurement unit measuring the current value on the circuit and providing the measured current value to the MCU.

7. The system of claim 6, wherein the MCU outputs the signal when the current value provided from the current measurement unit is more than the predetermined threshold.

8. The system of claim 6, wherein the current measurement unit is a shunt resistor.

9. The system of claim 1, wherein when the inner part of the fuse unit is disconnected by the heat, the specific current applied to the relay is blocked in the circuit.

10. A method for independently controlling a relay in a circuit, the method comprising:
    outputting, by a micro controller unit (MCU), a signal when a current value on the circuit is more than a predetermined threshold, wherein the signal is output directly to a signal inversion unit;

the signal inversion unit inverting and amplifying the signal output from the MCU and outputting the inverted and amplified signal directly to a switching unit; and applying, by the switching unit, a specific current directly to a bimetal unit to shape-transform the bimetal unit, wherein the shape-transforming of the bimetal unit changes a state of the relay from an on state to an off state to reduce a magnetic force of a relay coil of the relay and to block current flowing from a battery to the relay, wherein the shape-transforming of the bimetal unit includes:

generating, by a bimetal unit of the bimetal unit, heat by the specific current, bending bimetal of the bimetal unit in one direction by the heat, and applying the specific current on the circuit to one terminal portion of the bimetal as the one terminal portion of the bimetal contacts a contact of the circuit, wherein the heating unit is directly connected with the bimetal, wherein the circuit is further disconnected by a fuse unit that is connected with the heating unit and provided between the bimetal unit and the relay, and wherein an inner part of the fuse unit is disconnected by the heat generated from the heating unit.

11. The method of claim 10, wherein the inverting of the signal includes inverting, by the signal inversion unit, a low signal output from the MCU into a high signal.

12. The method of claim 10, wherein the applying of the specific current on the circuit includes changing the state of the relay from the on state to the off state as a current amount applied to the relay is reduced in the circuit.

13. The method of claim 10, further comprising:

measuring, by a current measurement unit, the current value on the circuit and providing the measured current value to the MCU.

14. The method of claim 13, wherein the outputting of the signal when the current value on the circuit is more than a predetermined threshold includes outputting, by the MCU, the signal when the current value provided from the current measurement unit is more than the predetermined threshold.

* * * * *